(12) United States Patent
Menon et al.

(10) Patent No.: US 7,714,988 B2
(45) Date of Patent: May 11, 2010

(54) SYSTEM AND METHOD FOR ABSORBANCE MODULATION LITHOGRAPHY

(75) Inventors: Rajesh Menon, Cambridge, MA (US); Henry I. Smith, Sudbury, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 773 days.

(21) Appl. No.: 11/331,752

(22) Filed: Jan. 13, 2006

(65) Prior Publication Data

US 2006/0183059 A1    Aug. 17, 2006

Related U.S. Application Data

(63) Continuation-in-part of application No. 11/154,352, filed on Jun. 16, 2005.

(60) Provisional application No. 60/653,766, filed on Feb. 17, 2005.

(51) Int. Cl.
*G03B 27/54* (2006.01)

(52) U.S. Cl. ............................. 355/70; 355/18; 355/67; 430/322; 430/311; 430/394; 430/396

(58) Field of Classification Search ....................... None
See application file for complete search history.

(56) References Cited

U.S. PATENT DOCUMENTS

| 4,904,569 | A |   | 2/1990 | Fukuda et al. |
|---|---|---|---|---|
| 5,625,613 | A | * | 4/1997 | Kato et al. ............. 369/112.15 |
| 2005/0064347 | A1 | * | 3/2005 | Wang ......................... 430/322 |

FOREIGN PATENT DOCUMENTS

| JP | 05072408 | 3/1993 |
|---|---|---|
| JP | 07248604 | 9/1995 |
| WO | 2004053938 | 6/2004 |
| WO | 2005031460 | 4/2005 |
| WO | 2006088643 | 8/2006 |

OTHER PUBLICATIONS

Schattenburg et al., "Sub-200 nm metrology using interferometrically produced fiducials" Journal of Vacuum Science & Technology B: Microelectronics Processing and Phenomena, American Vacuum Society, New York, NY, vol. 17, No. 6, Nov. 1999, pp. 2692-2697.

* cited by examiner

*Primary Examiner*—Daborah Chacko Davis
(74) *Attorney, Agent, or Firm*—Gauthier & Connors LLP

(57) ABSTRACT

A lithography system is disclosed that provides an array of areas of imaging electromagnetic energy that are directed toward a recording medium. The reversible contrast-enhancement material is disposed between the recording medium and the array of areas of imaging electromagnetic energy.

13 Claims, 15 Drawing Sheets

SYSTEM AND METHOD FOR ABSORBANCE MODULATION LITHOGRAPHY

The present application claims priority to U.S. Provisional Patent Application Ser. No. 60/653,766 filed on Feb. 17, 2005, and is a continuation-in-part application of U.S. Ser. No. 11/154,352 filed on Jun. 16, 2005.

BACKGROUND

The present invention relates generally to lithography, and in particular, to zone plate array lithography.

In a zone plate array lithography system, an array of diffractive lenses such as Fresnel zone plates may be used to form an array of tightly focused spots on a photosensitive layer that is on top of a substrate. For example, U.S. Pat. No. 5,900,637, the disclosure of which is hereby incorporated by reference, discloses a mask-less lithography system and method that employs a multiplexed array of Fresnel zone plates. The light incident on each diffractive lens may be controlled, for example, by one pixel of a spatial light modulator. The spatial light modulator for use in such a system should provide a high refresh rate, be able to operate at short wavelengths such as under 200 nm, and be able to perform gray-scaling or intensity modulation in real time.

One commercially available spatial light modulator that may satisfy the above requirements is the grating light valve (GLV) spatial light modulator made by Silicon Light Machines of Sunnyvale Calif. The GLV consists of a linear array of pixels, and each pixel consists of six metallic ribbons that form a diffraction grating. Alternate ribbons may be moved by electrostatic actuation to provide either a reflective surface or a grating.

The lithographic resolution, however, of such a system may be limited by the contrast of the aerial image. The image contrast is dependent on the printed pattern. The optical performance may be quantified by calculating the aerial image contrast of a dense grating as a function of the half-pitch of the grating. The image contrast, K is defined as:

$$K = \frac{I_{max} - I_{min}}{I_{max} + I_{min}} \quad (1)$$

where $I_{max}$ and $I_{min}$ are defined as the maximum and minimum intensities of an illumination signal that may be employed to provide a desired pattern. For example, as shown in FIG. 1, a desired pattern 10 that includes alternating imaged regions (as shown at 12) and non-imaged regions may be created using an illumination signal 14. Note that the pitch p of the desired grating pattern 10 corresponds to the pitch p of the illumination signal 14.

The intensity profile of the illumination signal 12, however, results in an imaging pattern on a photo-resist layer 16 when imaged by illumination source signals 18 (again having a pitch p). The photo-resist layer 16 is supported by a wafer 20, and includes marked regions in the photo-resist layer that have been exposed by the sources 18. After exposure, the photo-resist layer is developed, and the marked regions are removed, leaving exposed portions 22 of the underlying wafer 20. Efforts to increase resolution (e.g., decrease the pitch p), however, may result in a degradation in image contrast, due at least in part to the intensity profile of the illumination signal 14.

In particular, the aerial images for gratings of different periods may be simulated assuming a zone plate array lithography system of numerical aperture (NA)=0.7 and λ=400 nm. The cross-section through each grating may then be averaged over several line-scans, and the image contrast may be calculated using Equation (1) above. The image contrast may be plotted as a function of $k_1$, where $k_1$ is a measure of the lithographic resolution (normalized to the wavelength and NA), and is given by:

$$k_1 = \frac{p}{2} \frac{NA}{\lambda} \quad (2)$$

where NA is the numerical aperture and λ is the exposing wavelength. For example, a system of the prior art may provide that $k_1$=0.32, which corresponds to an image contrast of about 18%. As the pitch p becomes smaller, the image contrast will be negatively affected, due in part, to the spatial extent of each illumination source 18.

Contrast enhanced lithography may be employed in an effort to improve image contrast. In particular, as shown in FIGS. 2A-2D, a contrast-enhancement material 24 that is spin coated on top of a photo-resist layer 26 on a wafer 28. The contrast-enhancement material 24 may, for example, be a photo-bleachable polymer, whose absorption decreases (i.e., becomes more transparent) with increasing exposure dose. The intensity of transmitted light may be plotted as a function of time for an ideal contrast-enhanced system. Prior to exposure of the contrast-enhancement material 24, the material 24 is opaque, and almost no light passes through the material 24. After sufficient exposure by illumination beams 30, the material becomes transparent and light is transmitted in areas indicated at 32. Light is let through into the photo-resist layer only where the exposure dose is high enough to bleach the contrast-enhancement material 24 completely. This increases the contrast of the image recorded in the photo-resist. An antireflective coating between the photo-resist and the wafer may also be employed.

As shown in FIG. 2B, illumination is able to reach defined regions 34 of the wafer 28 only in areas where the contrast-enhancement material 24 has become transparent (as shown at 32). The contrast-enhanced material 24 is then removed as shown in FIG. 2C using a suitable medium in (such as water) in which the contrast-enhancement material 24 will dissolve. The defined regions 34 are then removed through photo-resist development, leaving openings 36 in the photo-resist layer 26 through which portions of the wafer 28 may become exposed as shown in FIG. 2D.

By employing a contrast-enhancement material and by controlling the photo-bleaching rate of the contrast-enhancement material, as well as the clearing dose of the photo-resist, one may enhance the contrast of the aerial image that is recorded in the photo-resist. The contrast enhancement material behaves, in essence, as a contact mask, which increases the contrast of the image recorded in the photo-resist. The contrast enhancement material is removed from the resist prior to development. If the contrast-enhancement material is incompatible with the photo-resist, a barrier layer is needed between the contrast-enhancement material and the photo-resist. This also incurs an additional step for removal of the barrier layer after exposure. There are several commercially available contrast-enhancement materials, some of which are water-soluble.

Ideally, such contrast-enhancement materials would become bleached by the illumination signal 14 in an on/off step pattern that provides an instantaneous step at the edge of each illumination beam. Since the beams, however, provide an intensity profile as shown in FIG. 1B, the contrast-enhancement material bleaches in varying amounts with distance from the center of each illumination beam. This limits resolution. Moreover, repeated illumination near a non-imaged area may accumulate over time, and may eventually reach a threshold within the material for becoming transparent.

Contrast-enhancement may also be achieved by diluting the developer or by using thin photo-resist layers, but such systems may also involve difficulties such as increased line-edge roughness, as well as difficulties with pattern transfer respectively.

There is a need therefore, for an imaging system that more efficiently and economically provides increased image contrast in mask-less lithography.

SUMMARY

In accordance with an embodiment, the invention provides a lithography system that provides an array of areas of imaging electromagnetic energy that are directed toward a recording medium. The reversible contrast-enhancement material is disposed between the recording medium and the array of areas of imaging electromagnetic energy.

In accordance with another embodiment, the invention provides a lithography system that includes a first interference system for providing an interference pattern of a first electromagnetic field of a first wavelength on a surface of a recording medium, as well as a reversible contrast-enhancement material being disposed between said recording medium and the first interference system.

In accordance with a further embodiment, the invention provides a method of forming a lithographic image on a photo-resist material. The method includes the step of illuminating at least a first portion of a reversible contrast-enhancement material and an associated portion of a photo-resist material with a first electromagnetic energy field having a first wavelength. The illumination of the reversible contrast-enhancement material causes the reversible contrast-enhancement material to change from a first state to a second state in the first portion. The method also includes the step of illuminating at least a second portion of the reversible contrast-enhancement material that with a second electromagnetic energy field having a second wavelength causing the reversible contrast-enhancement material to remain in said first state in the second portion.

BRIEF DESCRIPTION OF THE ILLUSTRATED EMBODIMENTS

The following description may be further understood with reference to the accompanying drawings in which.

Figure 5:
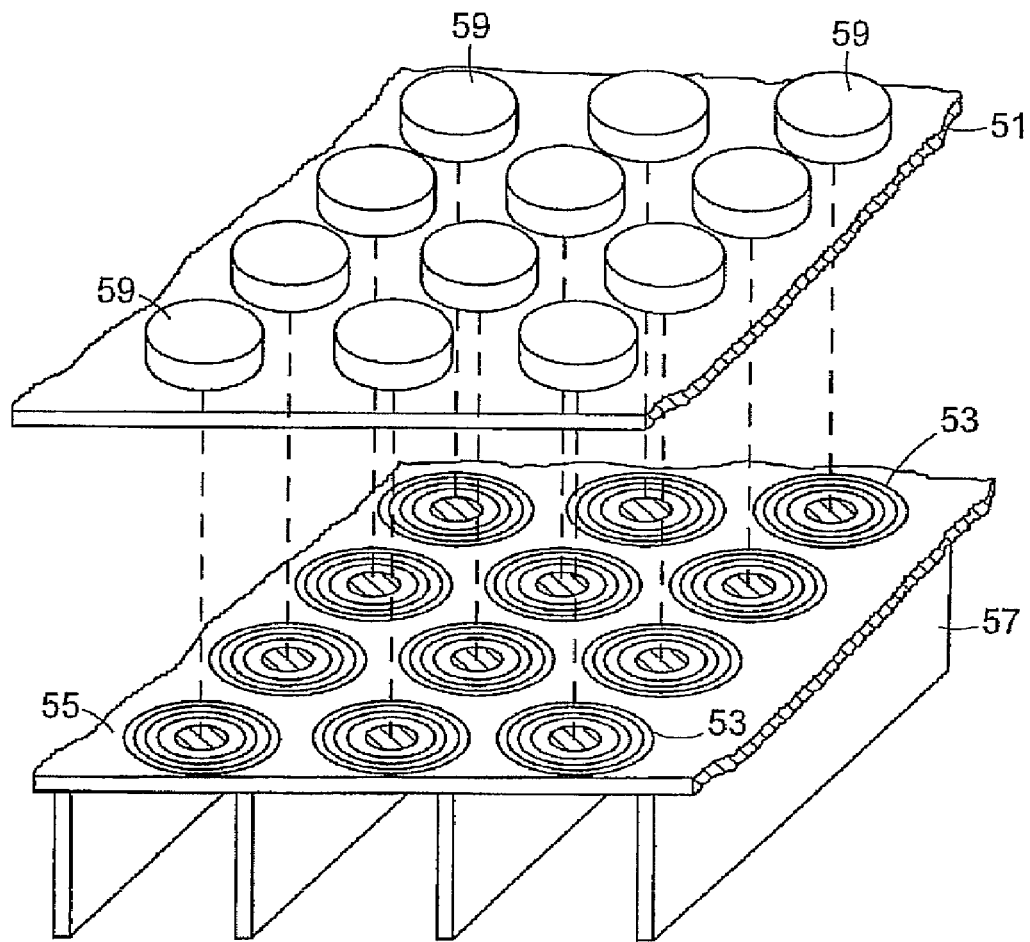
Figure 6:
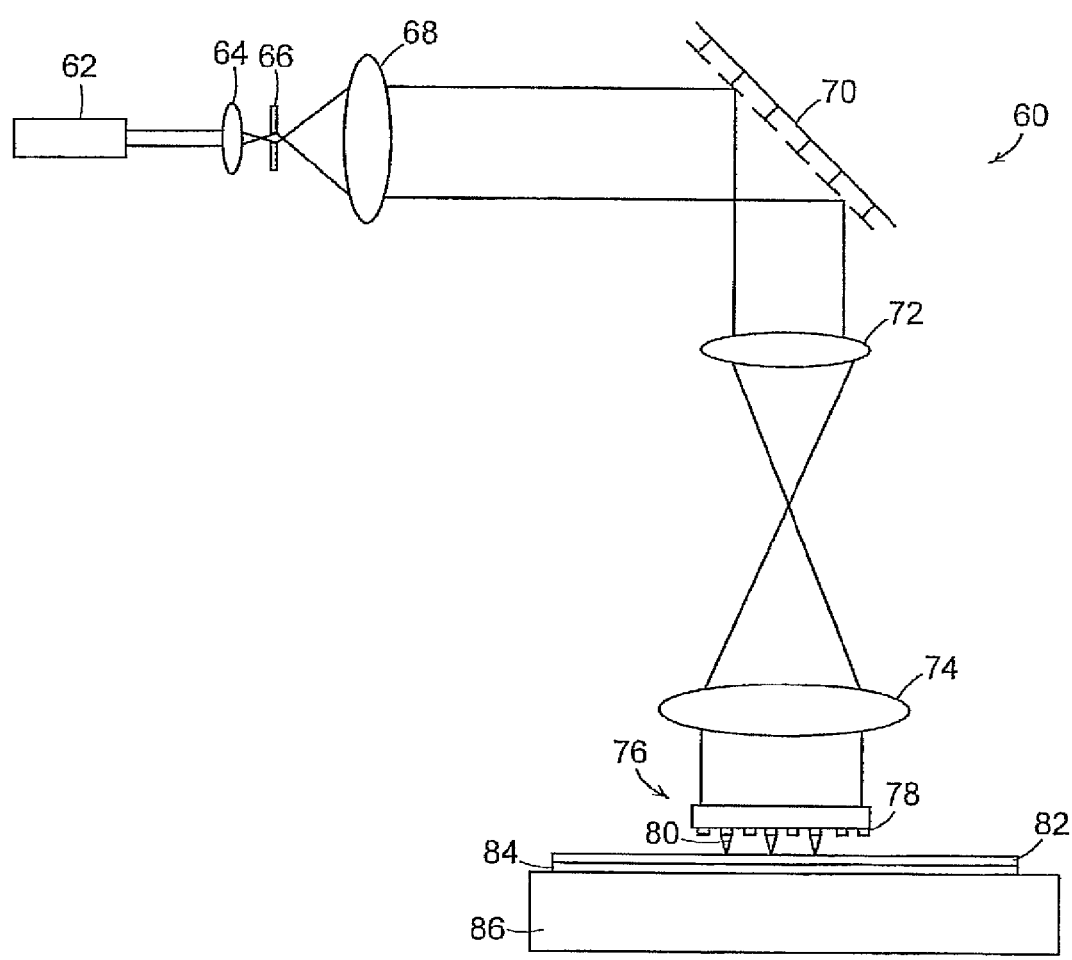
Figure 7:
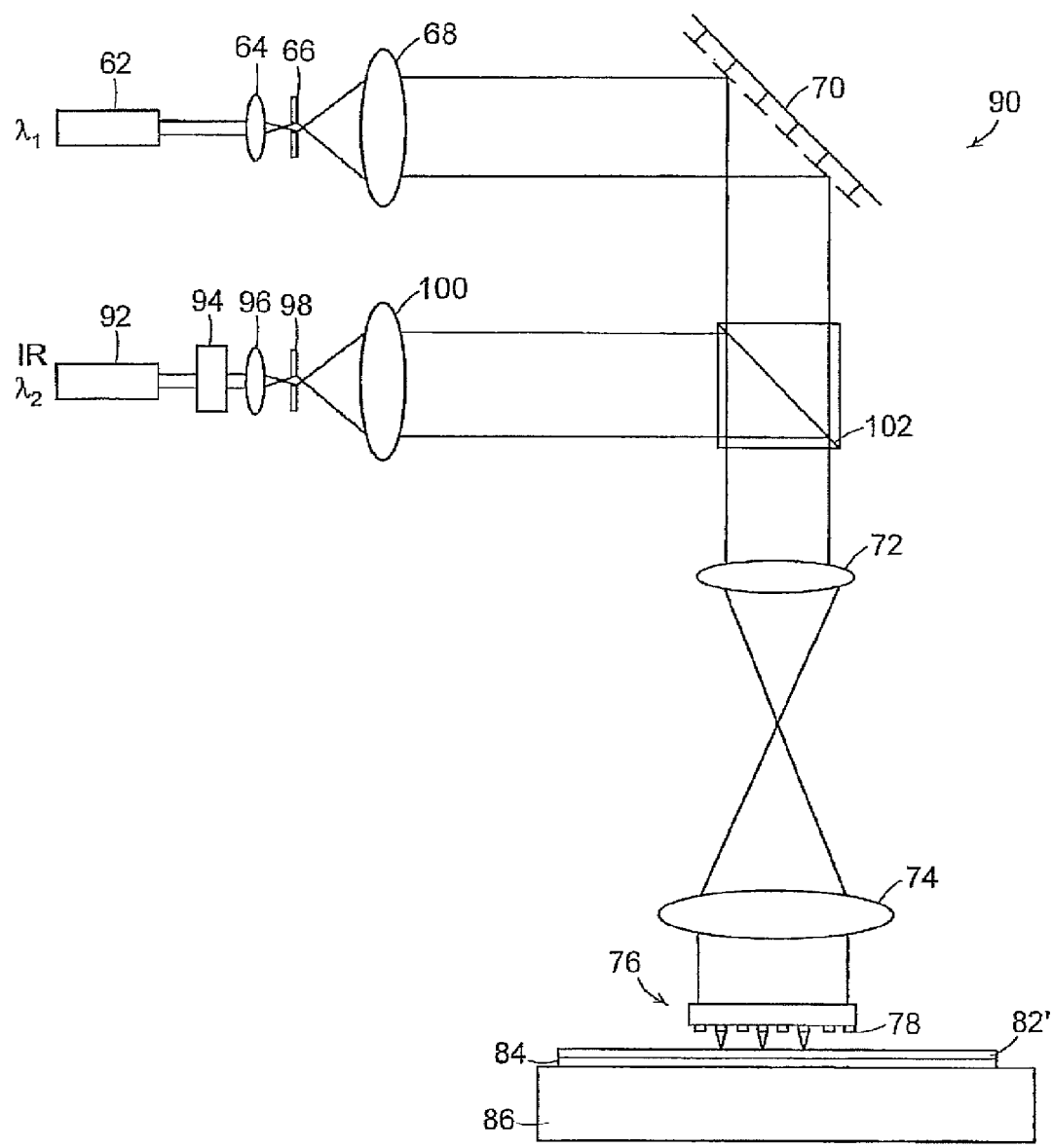
Figure 8:
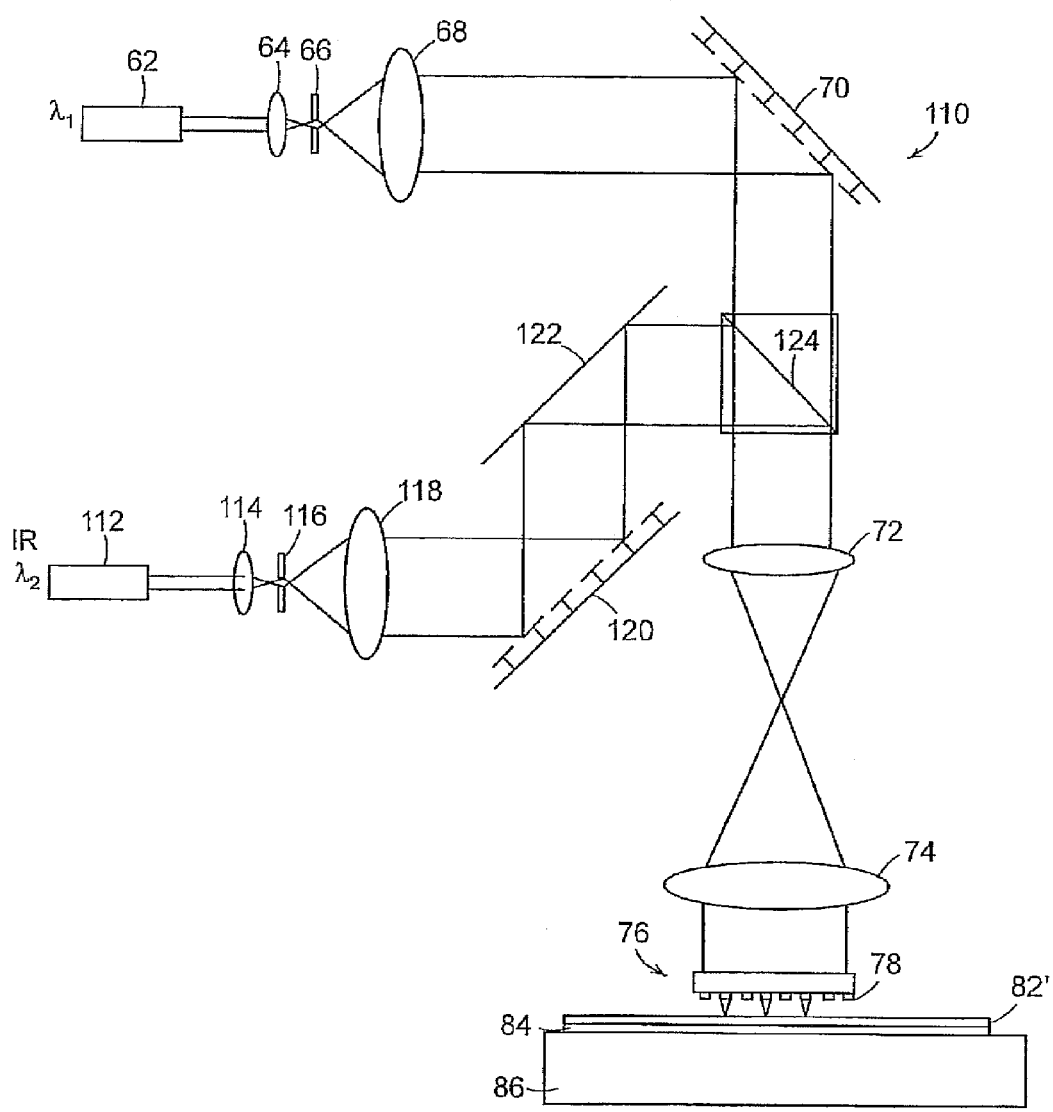
Figure 10:
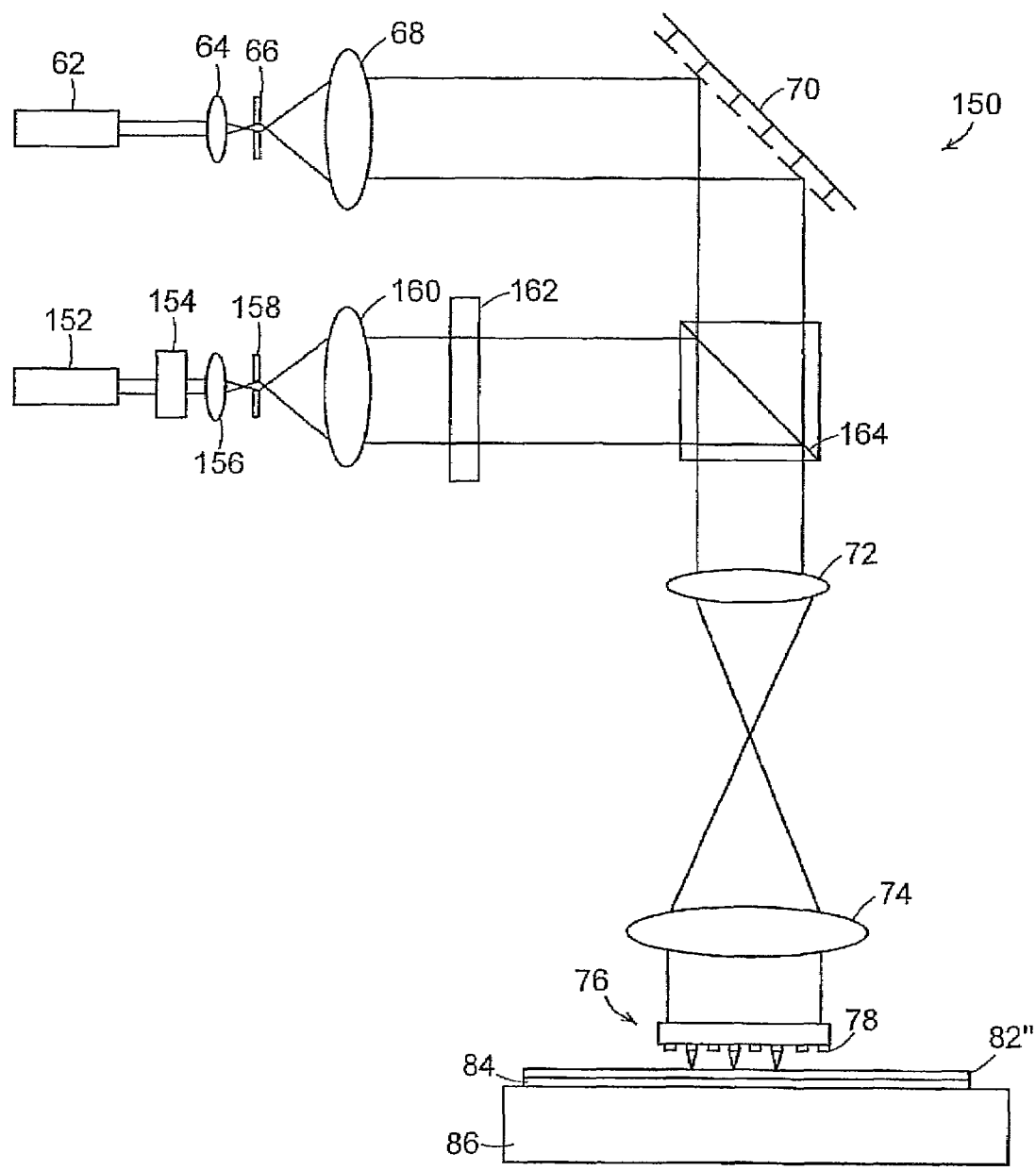
Figure 12:
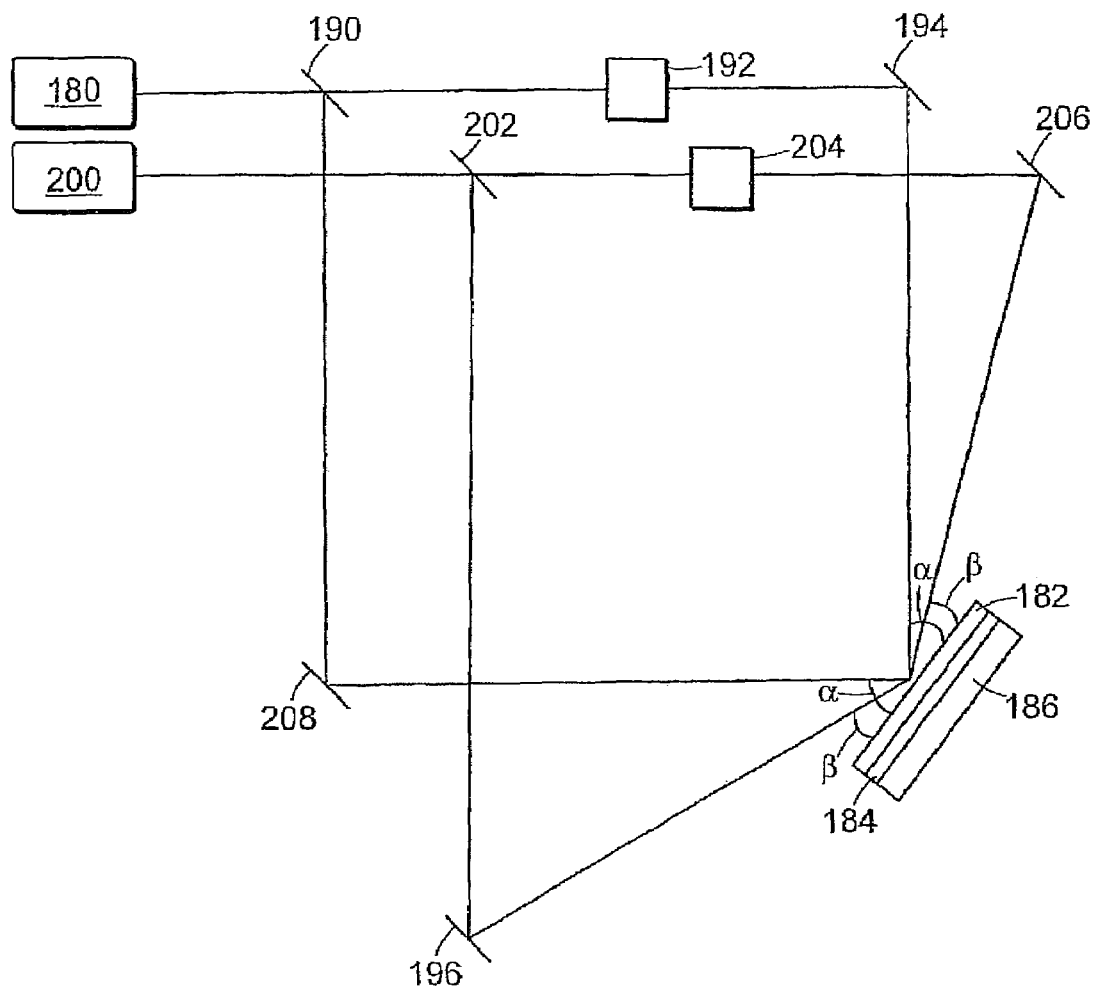
Figure 13:
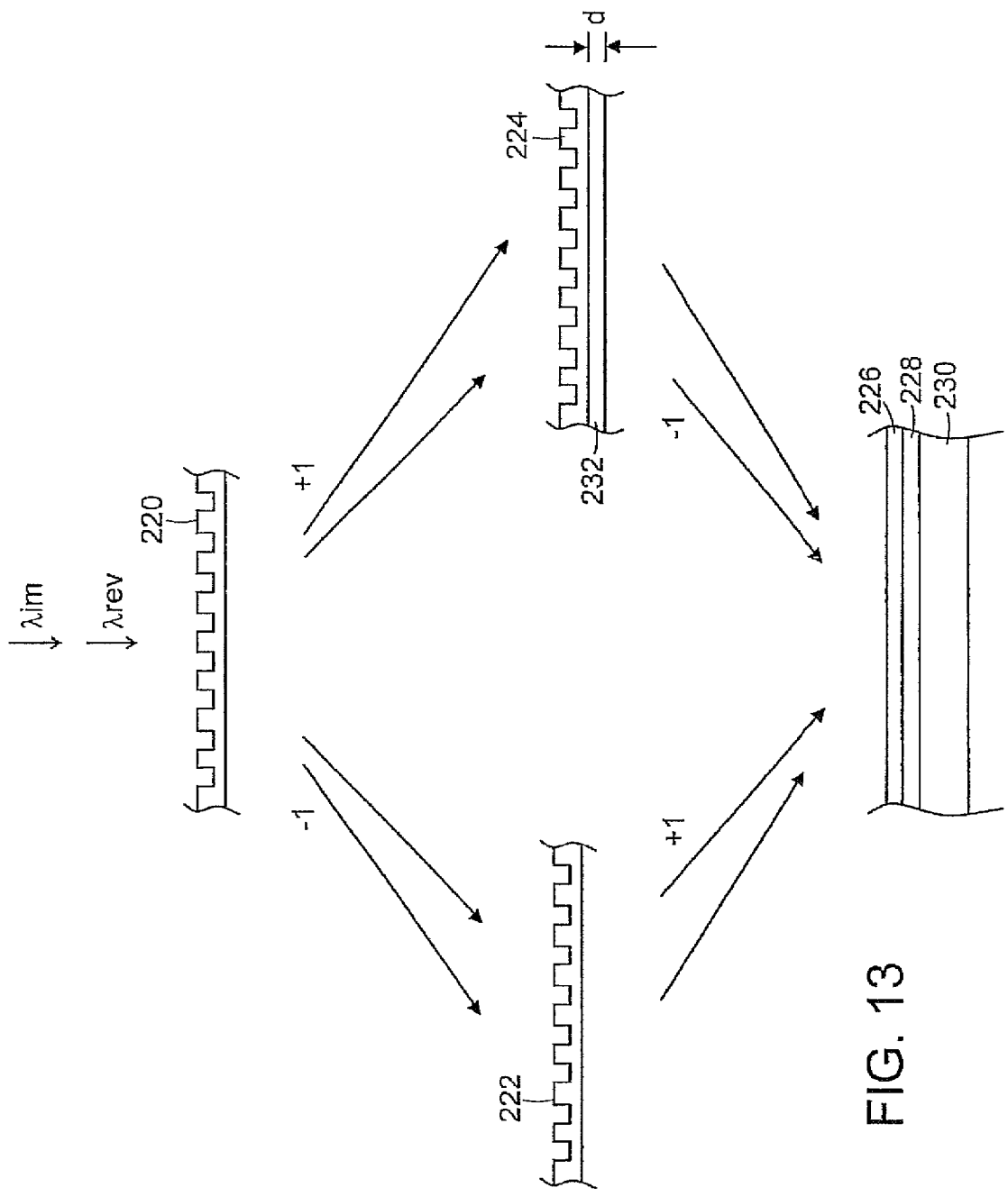

FIG. 5 shoes an illustrative diagrammatic exploded view of an array of energy sources and an array of diffractive elements for use in a system in accordance with an embodiment of the invention;

FIG. 6 shows an illustrative diagrammatic view of a lithography system in accordance with an embodiment of the invention;

FIG. 7 shows an illustrative diagrammatic view of a lithography system in accordance with another embodiment of the invention;

FIG. 8 shows an illustrative diagrammatic view of a lithography system in accordance with a further embodiment of the invention;

FIGS. 9A-9E show illustrative diagrammatic views of a system in accordance with a further embodiment of the invention that may be employed for forming marks having a scale smaller than the resolution of the imaging system;

FIG. 10 shows an illustrative diagrammatic view of a lithography system in accordance with a further embodiment of the invention;

FIGS. 11A-11F show illustrative diagrammatic representations of a lithography process in accordance with an embodiment of the invention;

FIG. 12 shows an illustrative diagrammatic view of a system in accordance with a further embodiment of the invention; and FIG. 13 shows an illustrative diagrammatic view of a system in accordance with a further embodiment of the invention The drawings are shown for illustrative purposes only and are not necessarily to scale.

DETAILED DESCRIPTION OF THE ILLUSTRATED EMBODIMENTS

The invention provides an absorbance modulation lithography system in which a contrast-enhancement material may be used that is reversible in accordance with an embodiment of the invention. The exposure dose due to the background in each focused illumination beam may then be completely eliminated from the contrast-enhancement material and therefore the recorded image. After reversal, the photo-resist will have no remaining recording of the previous exposures. Two spots, therefore, may be placed closer together than would otherwise have been possible using conventional contrast-enhancement material. Such imaging systems may be particularly suitable, for example, in dot-matrix printing systems in which each spot is printed independently of other spots. The smallest distance between exposed spots may, therefore, be much smaller than that dictated by the diffraction limit.

Figure 1A:
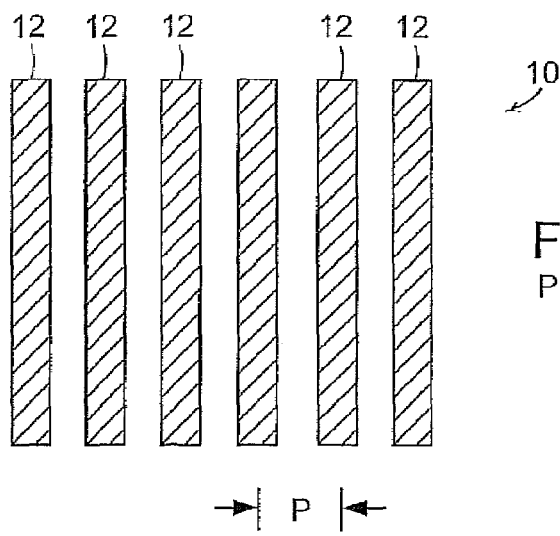
FIG. 1A shows an illustrative diagrammatic view of a desired image pattern.
Figure 1B:
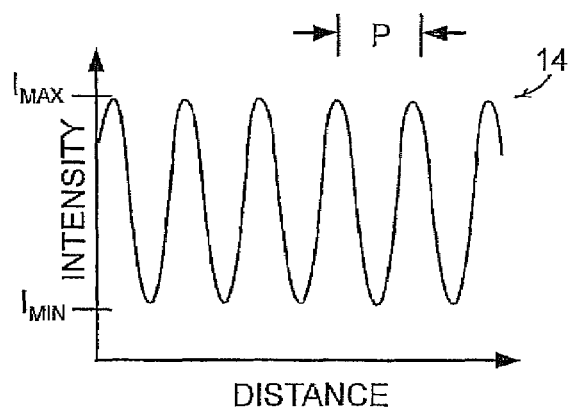
FIG. 1B shows an illustrative diagrammatic view of an illumination signal for forming an image pattern as shown in FIG. 1A.
Figure 1C:
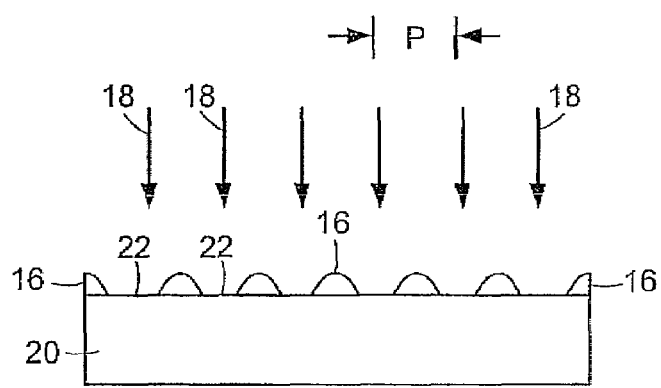
FIG. 1C shows an illustrative diagrammatic view of the formation of the desired image pattern shown in FIG. 1A using the illumination signal shown in FIG. 1B in accordance with the prior art.
Figure 2A:
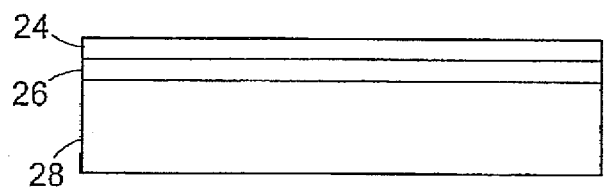
FIGS. 2A-2D show illustrative diagrammatic views of a process for forming the desired image pattern shown in FIG. 1A using contrast-enhanced lithography in accordance with another system of the prior art.
Figure 2B:
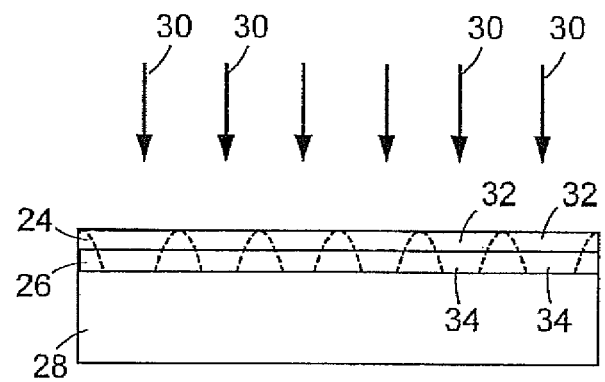
Figure 2C:
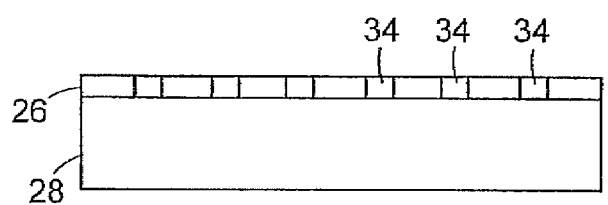
Figure 2D:
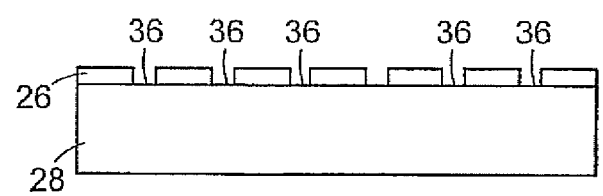
Figure 3A:
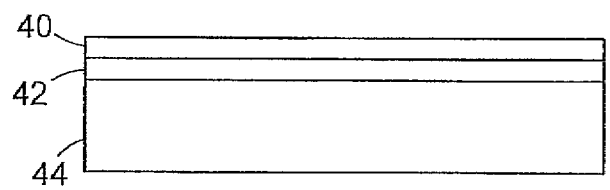
FIGS. 3A-3F show illustrative diagrammatic views of a process for forming the desired image pattern shown in FIG. 1A in accordance with another system of the prior art.
Figure 3B:
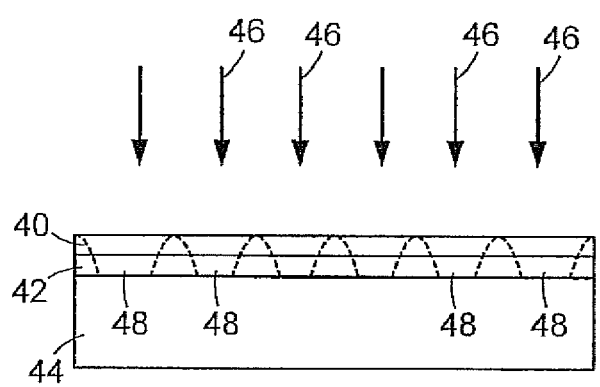
Figure 3C:
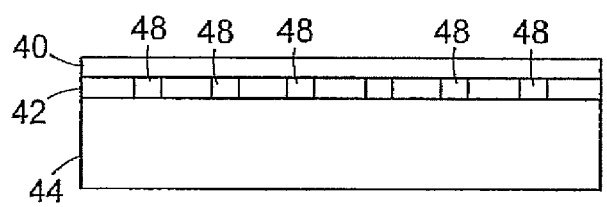

FIGS. 3A-3F show a lithography process in accordance with an embodiment of the invention. As shown in FIGS. 3A and 3B, a reversible contrast-enhancement material 40 on a photo-resist material 42 on a wafer 44 is imaged with illumination beams 46, causing imaged regions 48 to be formed in the photo-resist material 42. Once the illumination beams 46 cease, the reversible contrast-enhancement material 40 then reverts back to being opaque as shown in FIG. 3C.

Figure 3D:
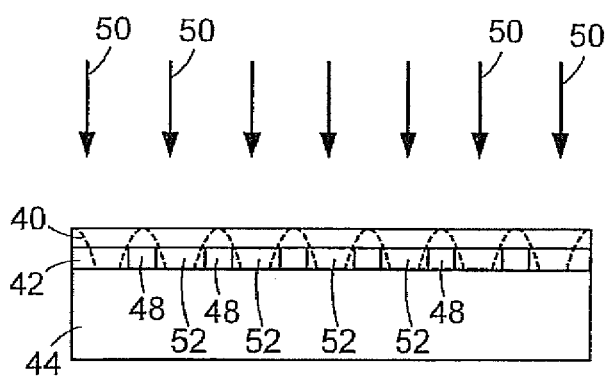
Figure 3E:
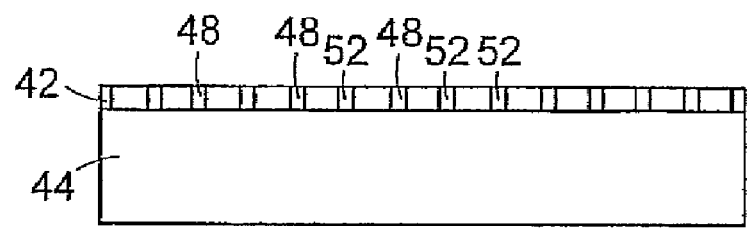
Figure 3F:
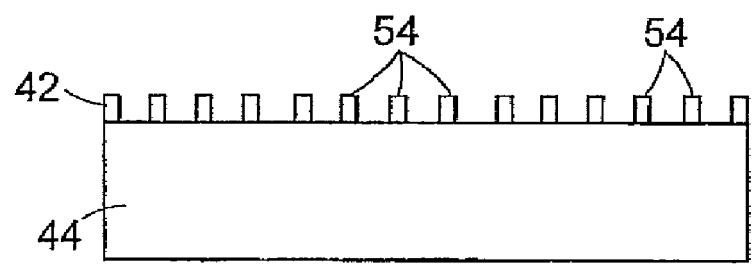

Then either the stage supporting the wafer is moved, or the illumination beams are moved. The composite is then imaged with illumination fields 50 at different locations with respect to the wafer than the image beams 46 as shown in FIG. 3D. This causes imaged regions 52 to be formed in the photo-resist material 42. The imaged regions 52 may be very close to the imaged regions 48 in the photo-resist material 42. When the reversible contrast-enhancement material is removed (as shown in FIG. 3E), the photo-resist material 42 may be developed, leaving the desired pattern of unexposed portions 54 in the photo-resist material 42 as shown in FIG. 3F.

Figure 4:
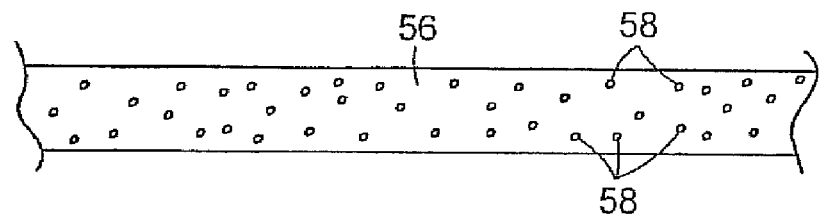
FIG. 4 shows an illustrative diagrammatic view of a reversible contrast enhancement material in accordance with another embodiment of the invention.

A photochromic organic compound, which includes reversible dyes under photochemical control, may be used for the reversible contrast-enhancement material. The recovery in this case occurs predominantly by thermal mechanism as is the case with spiropyrans, spirooxazines and chromenes. The thermally driven recovery may be aided by photochemical processes as well. In other compounds, the recovery may be predominantly photochemical (for, e.g., fulgides or arylethenes). In this case, exposure with a different wavelength (that does not affect the underlying photo-resist), may be used to induce the recovery. Such recovery is also present in the saturable absorbers used in mode locked lasers, although the contrast may not be particularly high. The recovery is preferably spontaneous. The ideal material for the reversible contrast enhancement will have a high contrast between the transparent and the opaque states. It will also have very fast photobleaching and recovery kinetics. It should also be easily spin-coated into a thin film on top of the photoresist on a flat substrate. Finally, it should be easily removed after exposure without affecting the underlying photoresist. Other potential candidates for this material are: nanoparticles dispersed in polymer matrices, photochromic dye molecules (described above) dispersed in polymer matrices, thin films of Antimony, or semiconductor saturable absorbers used in mode-locked lasers, and carbon nanotubes. For example, FIG. 4 shows a substrate material 56 (e.g., a polymer matrix) that includes photochromic dye molecules 58.

A lithography system in accordance with an embodiment of the invention may be used with arrays of a variety of focusing elements, such as Fresnel zone plates as disclosed in U.S. Pat. Nos. 5,900,637 and 6,894,292, the disclosures of which are hereby incorporated by reference. As shown in FIG. 5, an array of focusing elements 53 may be arranged on a substrate 55, wherein each zone plate defines a unit cell. The array is supported on a thin membrane with vertical, anisotropically-etched silicon (Si) joists 57 for rigid mechanical support that divide rows of unit cells. In alternative embodiments of the invention, the joists may not be necessary, and the substrate need not be formed of silicon. The membrane is formed of a material that is transparent to the beam source. If the source is 4.5 nm x-ray, then the membrane may be formed of a thin carbonaceous material. If deep UV radiation is used, the membrane may be made of glass, and the zone plates may be made from phase zone plates, e.g., grooves cut into a glass plate or membrane.

An array of individually selectable sources 59 is also provided on a support substrate 51 such that each source is aligned with one of the focusing elements 53. The sources may be semiconductor lasers, diode lasers, light emitting diodes (LEDs), vertical cavity surface emitting lasers (VCSELs) or a variety of other sources such as x-ray sources or electron beam sources. These may be microfabricated in arrays, and may provide extremely high modulation frequencies (about 1 GHz), which translates to very high patterning speeds. In further embodiments, the each source 59 may include a micro-lens and/or phase-shift mask that provides a de-focused pattern (e.g., a ring phase shifted to $\pi/2$) at the corresponding focusing element 53 to narrow the point spread function at the image plane.

The focusing elements may be any of a variety of diffractive and/or refractive elements including those disclosed in U.S. patent application Ser. No. 10/624,316 filed Jul. 22, 2003, (the disclosure of which is hereby incorporated by reference) which claims priority to U.S. Provisional Applications Ser. Nos. 60/397,705 and 60/404,514, including, for example, amplitude and/or phase Fresnel zone plates, blazed Fresnel zone plates, bessel zone plates, photon sieves (e.g., amplitude photon sieves, phase photon sieves, or alternating phase photon sieves), and the diffractive focusing elements may be apodized. These may be microfabricated in large arrays as well, and may be designed to compensate for wavefront characteristics in the radiation output from the source array to achieve, for example, the smallest possible focal spot.

FIG. 6 shows an example of a lithography system 60 in accordance with an embodiment of the invention. The system 60 includes a laser source 62, an imaging lens 64, a spatial filter 66, a collimating lens 68, a spatial light modulator 70, telescoping lenses 72, 74, a diffractive element array 76 including a plurality of diffractive elements 78, and a photo-resist material 84 that is covered by a reversible contrast-enhancement material 82 and is supported by a stage 86. The reversible contrast-enhancement material 82 is used as a top coat on the photo-resist material 84. The diffractive elements may be zone plates (such as Fresnel zone plates) or photon sieves.

Illumination from the laser source 62 is directed toward the spatial light modulator 70, and light is selectively reflected from the spatial light modulator 70 onto specific zone plates 78 of the zone plate array 76 for forming the desired imaging pattern. The illuminated zone plates 78 direct focused illumination onto desired locations of the photo-resist material 86 as shown at 80. The scanning stage may be moved to provide the desired image pattern over the entire photo-resist material 84. In this example, the exposing wavelength bleaches the reversible contrast-enhancement material. When the exposing illumination is turned off (either by the laser turning off or the spatial light modulator moving the illumination beam away from the zone plates 78), the reversible contrast-enhancement material relaxes spontaneously. The timing of the on and off states of the exposing light is controlled to achieve the appropriate exposure of the photo-resist.

In accordance with another embodiment, a system 90 (shown in FIG. 7) may include a laser source 62, an imaging lens 64, a spatial filter 66, a collimating lens 68, a spatial light modulator 70, telescoping lenses 72, 74, a zone plate array 76 including a plurality of zone plates 78, and a photo-resist material 84 that is covered by a reversible contrast-enhancement material 82' and is supported by a stage 86 similar to those shown in FIG. 6. As also shown in FIG. 7, however, the relaxation of the reversible contrast-enhancement material 82' of the system 90 may be assisted by exposure with infrared (IR) illumination (if, for example, the relaxation is thermal), or by exposure with illumination having a second wavelength ($\lambda_2$) that is different than the wavelength ($\lambda_1$) of the laser source 62 (if, for example, the relaxation is photo-initiated).

The exposure of the IR or $\lambda_2$ illumination may be provided by a source 92, shutter or acousto-optic modulator (AOM) 94, an imaging lens 96, a spatial filter 98, a collimating lens 100 and a beam splitter/combiner 102. This system 90 provides that the exposure of the IR or $\lambda_2$ illumination for relaxing the reversible contrast-enhancement material 82' floods the reversible contrast enhancement material 82' after each time that the source 62 and modulator 70 are used for imaging a spot on the photo-resist material 84. The AOM 94 may be used to switch the exposure for relaxation in rhythm with the exposing wavelength. The relaxation exposure is turned on when the exposing wavelength is turned off.

In accordance with a further embodiment of the invention, a system 110 may provide for relaxation of selective regions of the reversible contrast-enhancement material as shown in FIG. 8. In particular, the system 110 may include a laser source 62, an imaging lens 64, a spatial filter 66, a collimating lens 68, a spatial light modulator 70, telescoping lenses 72, 74, a zone plate array 76 including a plurality of zone plates 78, and a photo-resist material 84 that is covered by a reversible contrast-enhancement material 82' and is supported by a stage 86 similar to those shown in FIG. 6. As also shown in FIG. 8, however, the relaxation of the reversible contrast-enhancement material 82' of the system 110 may be assisted by exposure with IR illumination, or by exposure with illumination having a second wavelength ($\lambda_2$) that is different than the wavelength ($\lambda_1$) of the laser source 62. The exposure of the IR or $\lambda_2$ illumination may be provided by a source 112, an imaging lens 114, a spatial filter 116, a collimating lens 118, a second spatial light modulator 120, a mirror 122, and a beam splitter/combiner 124. This system 110 provides that the exposure of the IR or $\lambda_2$ illumination for relaxing the reversible contrast-enhancement material 82' is selectively directed to desired locations of the reversible contrast enhancement material 82' immediately after imaging of the associated locations on the photo-resist material 84. The focusing of the IR or $\lambda_2$ illumination may be achieved by using the same zone plates 78 of the zone plate array 76, either by providing that the zone plates 78 are sufficiently focused at the desired locations to achieve relaxation of the reversible contrast-enhancement material, or by providing that the zone plates 78 are designed to focus illumination of wavelengths $\lambda_1$ and either IR or $\lambda_2$ at the same focal distance.

In accordance with yet another embodiment, the invention may provide that a shaped-beam may be used to create a null in the reversible contrast-enhanced material at the desired exposed location. For example and as shown in FIGS. 9A-9E, a photo-resist material 130 may be top coated with a reversible contrast-enhancement material 132 (and may also include an anti-reflective coating between the photo-resist material and the wafer 134, as well as a barrier layer if desired). The reversible contrast-enhancement material in this example, however, is initially transparent to exposing illumination having a wavelength $\lambda_{exp}$. The reversible contrast-enhancement material becomes opaque when exposed to illumination having a transforming wavelength $\lambda_{tr}$.

Figure 9A:
Figure 9B:
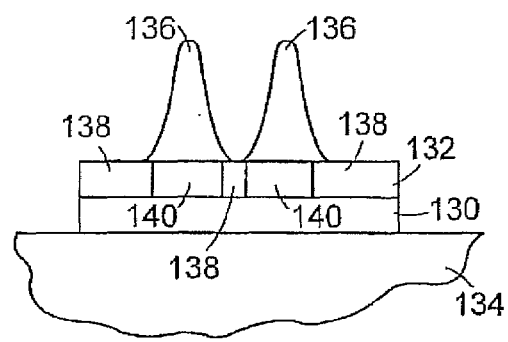
Figure 9C:
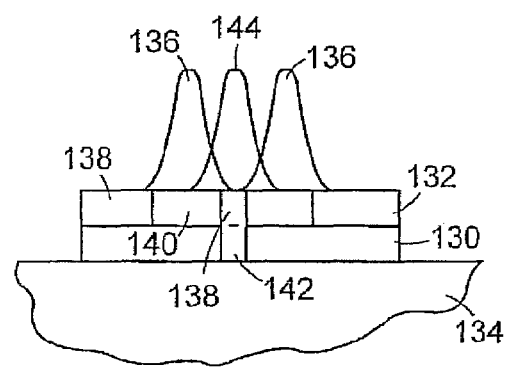

In particular, as shown in FIG. 9B, an annular ring spot is first created using the illumination $\lambda_{tr}$ as diagrammatically shown at 136. The illumination 136 causes the reversible contrast-enhancement material 132 to develop opaque regions 140 while leaving transparent regions 138 as shown in FIG. 9B. The transparent region 138 that is in the center of the ring spot is then used as a mask for illuminating the photo-resist material 130 at that location 142 using exposure illumination 144 ($\lambda_{exp}$) as shown in FIG. 9C. The imaged region 142 may be smaller than the smallest imaging element size possible using conventional imaging, and is made possible by using the reversible contrast-enhanced material in accordance with an embodiment of the invention.

Figure 9D:
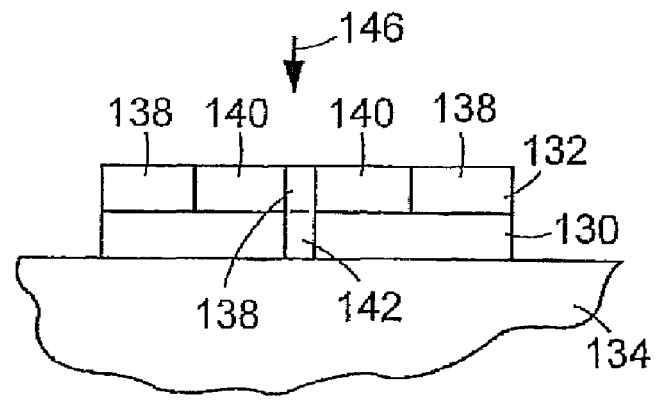
Figure 9E:
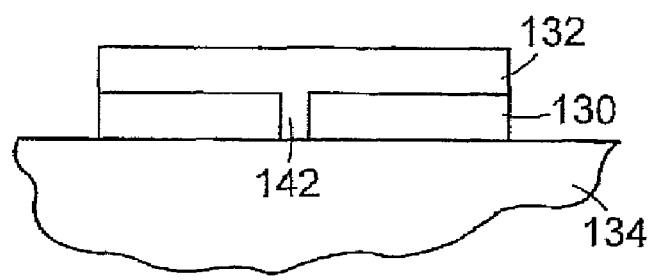

The system may then either wait until the reversible contrast-enhancement material relaxes and becomes transparent again, or may apply a relaxation illumination 146 (e.g., IR or another wavelength illumination $\lambda_{ret}$) to cause the reversible contrast-enhancement material to relax and become transparent again as shown in FIGS. 9D and 9E. The wavelength $\lambda_{ret}$ may be equal to $\lambda_{tr}$.

As shown in FIG. 10, a system 150 for providing the annular ring spot used in FIGS. 9A-9E may include the laser source 62, the imaging lens 64, the spatial filter 66, the collimating lens 68, the spatial light modulator 70, telescoping lenses 72, 74, the diffractive element array 76 including a plurality of diffractive elements 78, and the photo-resist material 84 that is covered by the reversible contrast-enhancement material 82" and is supported by the stage 86 as discussed above with reference to FIG. 6. The system also includes a source 152 (of $\lambda_{tr}$ illumination), a shutter or acousto-optic modulator (AOM) 154, an imaging lens 156, a spatial filter 158, a collimating lens 160, a phase plate 162, and a beam splitter/combiner 164. The phase plate 162 provides a phase shift in the $\lambda_{tr}$ illumination (for example a spiral phase shift) to provide the annular ring spot illumination 136 shown in FIGS. 9B and 9C.

Figure 11A:
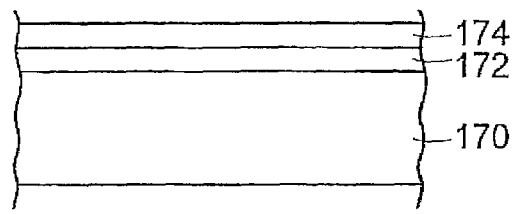
Figure 11B:
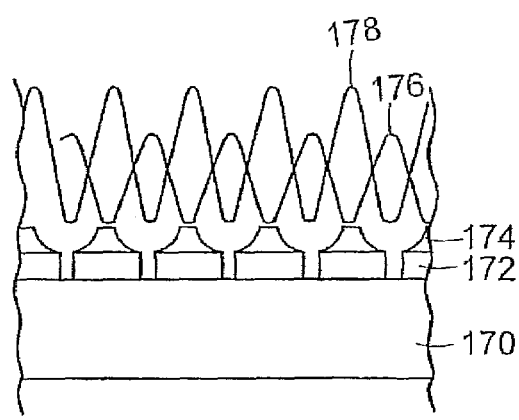

In accordance with another embodiment, the system may provide an absorbance modulation lithography system in which a reversible contrast-enhancement material 174 deposited on a photo-resist 172 on a substrate 170 as shown in FIG. 11A is illuminated with a standing illumination waveform 176 as shown in FIG. 11B. The waveform 176 is provided at an imaging frequency of $\lambda_{im}$. Another standing waveform 178 may also be provided at a reversing frequency $\lambda_{rev}$ at which the reversible contrast-enhancement material may be actively reversed. The waveforms 176 and 178 are provided 180 degrees out of phase from one another and may be sufficiently close in frequency that they remain synchronous over the imaging region. The photo-resist is chosen such that it may be imaged by an electromagnetic field at a frequency $\lambda_{im}$ but not by a field at a frequency of $\lambda_{rev}$.

Figure 11C:
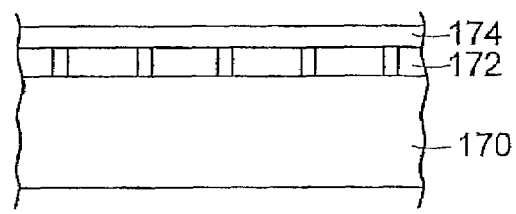

The standing waves may be formed by interference of monochromatic coherent sources as discussed below with reference to FIGS. 12 and 13. As shown in FIG. 11B, both the waveforms 176 and 178 may be provided at the same time such that the nodes of the grating at $\lambda_{im}$ coincide with the anti-nodes of the grating at $\lambda_{rev}$. The intensities of the illumination at the frequencies $\lambda_{im}$ and $\lambda_{rev}$ may be adjusted independent of one another to provide that the resist 172 is exposed in the desired amount for specific applications. As shown in FIG. 11C, following exposure, the entire material 174 is reversed either by flood exposure to illumination at the wavelength $\lambda_{rev}$ or by waiting for the material 174 to reverse on its own or due to application of thermal energy as discussed above. The wavelength of the reversing illumination $\lambda_{rev}$ may be greater than that of the imaging illumination wavelength $\lambda_{im}$ but less than twice the imaging illumination wavelength ($<2\lambda_{im}$).

Figure 11D:
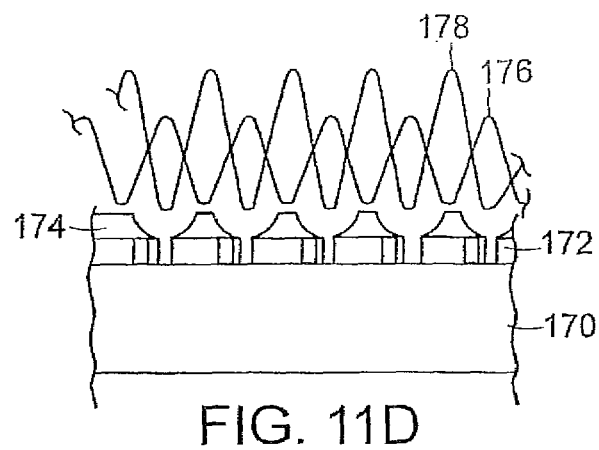
Figure 11E:
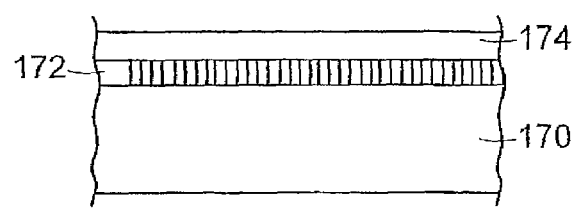
Figure 11F:
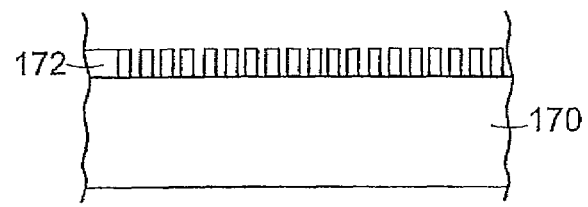

The substrate 170 may be stepped by a small amount as determined by the desired pitch of the final grating. In further embodiments, rather than stepping the substrate, the fringes of the incident gratings may be moved by changing the phase of the incident illumination. These steps may be implemented without requiring the removal of the substrate from the lithography tool. As shown in FIG. 11D, the photo-resist 172 may then again be imaged (optionally at the same time as the π/2 shifted reversing illumination) at different areas of the photo-resist 172. The process may then be repeated as necessary to provide a photo-resist 172 with very finely developed features in the photo-resist 172 as shown in FIG. 11E. The reversible contrast-enhancement material 174 may then be removed as shown in FIG. 11F.

As shown in FIG. 12, a system in accordance with an embodiment of the invention includes in imaging laser source 180 that is directed via imaging optics toward a reversible contrast-enhancement material 182 on a photo-resist 184 on a substrate 186. The imaging optics include a beam splitter 190, an adjustable delay unit 192, mirrors 194 and 196. The system may also include a reversing illumination laser source 200 that directs reversing illumination toward the surface of the material 182 via a beam splitter 202, an adjustable delay unit 204, mirrors 206 and 208. The optical path lengths from the laser 180 are controlled to ensure that the two portions of the imaging illumination provide interference at the material 182 (from +/− angle α) that yields a standing waveform of $\lambda_{im}$ on the material 182. Similarly, the optical path lengths from the laser 200 are controlled to ensure that the two portions of the imaging illumination provide interference at the material 182 (from +/− angle β that is less than α) to yield a standing waveform of $\lambda_{rev}$ on the material 182. Since the period is defined as P=λ/sin θ, the period of each of the waveforms may be set to be equal to one another by requiring that $\lambda_{im}$/sin α=$\lambda_{rev}$/sin β.

A lithography system in accordance with a further embodiment of the invention includes a diffraction grating 220 that receives incident imaging and optional reversing illumination (at wavelengths $\lambda_{im}$ and $\lambda_{rev}$). The grating and incidence angle are adjusted to provide positive and negative first order diffraction as shown, and the first order diffracted illumination is received by additional gratings 222 and 224 as shown in FIG. 13. Each of the gratings 222 and 224 provides positive and negative first order diffraction as well, and the positive first order diffraction from one grating is interfered with the negative first order diffraction from the other grating as shown in FIG. 13. The interference of the fields occurs at a reversible contrast-enhancement material 226 on a photo-resist 228 on a substrate 230. One of the gratings 224 includes a phase delay unit that comprises a substrate 232 (such as glass) having a thickness (d) such that the Difference in phase shifts is provided by the substrate 232 to both wavelengths of illumination that pass through the substrate 232. In particular, the phase shift (φ) in the material 232 is provided by the optical path length through the material 232 divided by the wavelength of the illumination in the material 232. The difference in phase shift $\phi_{im}-\phi_{rev}$ is set to equal π, and the thickness d is determined knowing $\lambda_{im}$, $\lambda_{rev}$, and the indices of refraction of the material 232 at the two wavelengths solving for the above equations. The system, therefore, provides an achromatic interference lithography system.

Those skilled in the art will appreciate that numerous modifications and variations may be made to the above disclosed embodiments without departing from the spirit and scope of the invention.

What is claimed is:

1. A lithography system for forming an image in a recording medium comprising a reversible contrast-enhancement material located on top of said recording medium said reversible contrast-enhancement material is illuminated with a first wavelength provided in the form of a first standing-illumination waveform, said first standing-illumination waveform having a multiplicity of smaller regions of minimum intensity adjacent to regions of higher intensity, a second wavelength being provided that simultaneously illuminates at least the regions of minimum intensity.

2. The lithography system as claimed in claim 1, wherein said reversible contrast-enhancement material includes a photochromic organic compound.

3. The lithography system as claimed in claim 1, wherein said reversible contrast-enhancement material includes any of photochromic dye molecules, a thin film antimony, a semiconductor saturable absorbers and carbon nanotubes.

4. The lithography system as claimed in claim 1 wherein said first standing-illumination waveform is created by interference of two or more electromagnetic fields.

5. The lithography system as claimed in claim 4, wherein said system further provides an array of areas of reversing electromagnetic energy as said first standing-illumination waveform.

6. The lithography system as claimed in claim 5, wherein said first standing-illumination waveform is provided by interference of two or more reversing fields that were originally separated from one another by a diffraction grating.

7. The lithography system as claimed in claim 4, wherein said first standing-illumination waveform is provided by interference of two or more imaging-fields that were originally separated from one another by a diffraction grating.

8. A lithography system for forming an image in a recording medium comprising a first interference means for providing an interference pattern of a first wavelength on the surface of a reversible contrast-enhancement material that is disposed between said recording medium and said first interference means, and a second interference means for providing an interference pattern of a second wavelength on the surface of the reversible contrast-enhancement material, said first wavelength being suitable for reversing a state of the reversible contrast-enhancement material, the first wavelength being provided in the form of a first standing-illumination waveform having a multiplicity of smaller regions of minimum intensity adjacent to regions of higher intensity, said second wavelength being provided in the form of a second standing-illumination waveform that simultaneously illuminates at least the regions of minimum intensity.

9. The lithography system as claimed in claim 8, wherein aid reversible contrast-enhancement material includes a photochromic organic compound.

10. The lithography system as claimed in claim 8, wherein said first interference means includes a plurality of diffraction gratings.

11. The lithography system as claimed in claim 8, wherein said second interference means includes a plurality of diffraction gratings.

12. The lithography system as claimed in claim 8, wherein said first standing-illumination waveform comprises a period P and said second standing-illumination waveform comprises the same period P.

13. The lithography system as claimed in claim 8, wherein the spatial phase of said first standing-illumination waveform and the spatial phase of said second standing-illumination waveform differ by 180 degrees.

\* \* \* \* \*